(12) United States Patent
Hao et al.

(10) Patent No.: US 11,387,313 B2
(45) Date of Patent: Jul. 12, 2022

(54) DISPLAY PANEL AND DISPLAY APPARATUS

(71) Applicants: BOE TECHNOLOGY GROUP CO., LTD., Beijing (CN); ORDOS YUANSHENG OPTOELECTRONICS CO., LTD., Ordos Inner Mongolia (CN)

(72) Inventors: Xueguang Hao, Beijing (CN); Fang Liu, Beijing (CN); Bo Zhang, Beijing (CN)

(73) Assignees: BOE TECHNOLOGY GROUP CO., LTD., Beijing (CN); ORDOS YUANSHENG OPTOELECTRONICS CO., LTD., Ordos Inner Mongolia (CN)

( * ) Notice: Subject to any disclaimer, the term of this patent is extended or adjusted under 35 U.S.C. 154(b) by 0 days.

(21) Appl. No.: 17/032,110

(22) Filed: Sep. 25, 2020

(65) Prior Publication Data
US 2021/0013293 A1 Jan. 14, 2021

Related U.S. Application Data

(63) Continuation-in-part of application No. 16/301,911, filed as application No. PCT/CN2018/080179 on Mar. 23, 2018, now Pat. No. 10,825,749.

(30) Foreign Application Priority Data

May 22, 2017 (CN) .......................... 201710363929.4

(51) Int. Cl.
*H01L 27/32* (2006.01)
*H01L 51/52* (2006.01)

(52) U.S. Cl.
CPC ...... *H01L 27/3276* (2013.01); *H01L 27/3246* (2013.01); *H01L 27/3248* (2013.01); *H01L 51/5246* (2013.01)

(58) Field of Classification Search
None
See application file for complete search history.

(56) References Cited

U.S. PATENT DOCUMENTS 9,496,320 B2 * 11/2016 Hong ................. H01L 27/3276
2015/0236297 A1 * 8/2015 Hong ................. H01L 51/5246
257/40

(Continued)

FOREIGN PATENT DOCUMENTS

CN 105572941 A 5/2016
CN 205789978 U 12/2016

(Continued)

OTHER PUBLICATIONS

First Office Action dated Jun. 28, 2018, relating to CN Patent Application No. 201710363929.4.

(Continued)

*Primary Examiner* — Mounir S Amer
(74) *Attorney, Agent, or Firm* — Dinsmore & Shohl LLP

(57) ABSTRACT

The disclosure relates to a display panel and a display apparatus. The display panel comprises: a substrate comprising a substrate display region corresponding to a display panel display region and a substrate non-display region corresponding to a display panel non-display region; a non-display region circuit located at the substrate non-display region; and a packaging layer located on the non-display region circuit and having at least a partial overlap area with the non-display region circuit, wherein the non-display region circuit comprises: a first conductive pattern; at least one buffer layer located at a side of the first conductive pattern close to the substrate; at least one gate insulating layer configured to electrically insulate the first conductive pattern and other conductive patterns; and at (Continued)

least one interlayer insulating layer located at a side of the first conductive pattern away from the substrate.

16 Claims, 20 Drawing Sheets

(56) References Cited

U.S. PATENT DOCUMENTS

| | | | |
|---|---|---|---|
| 2016/0079324 A1* | 3/2016 | Go | ................ H01L 27/3246 257/88 |
| 2018/0085976 A1 | 3/2018 | Fan et al. | |

FOREIGN PATENT DOCUMENTS

| | | |
|---|---|---|
| CN | 106646998 A | 5/2017 |
| CN | 107195657 A | 9/2017 |
| JP | 2003059645 A | 2/2003 |

OTHER PUBLICATIONS

Second Office Action dated Nov. 23, 2018, relating to CN Patent Application No. 201710363929.4.
Rejection Decision dated Apr. 3, 2019, relating to CN Patent Application No. 201710363929.4.
Reexamination Notification dated Dec. 30, 2019, relating to CN Patent Application No. 201710363929.4.
Reexamination Decision dated May 15, 2020, relating to CN Patent Application No. 201710363929.4.
International Search Report and Written Opinion for corresponding PCT Application No. PCT/CN2018/080179 dated Jun. 26, 2018.

* cited by examiner

DISPLAY PANEL AND DISPLAY APPARATUS

CROSS REFERENCE TO RELATED APPLICATIONS

The present application is continuation in part of U.S. patent application Ser. No. 16/301,911 filed on Nov. 15, 2018, which is a U.S. National Stage Application Under 35 U.S.C. § 371 of International Patent Application No. PCT/CN2018/080179 filed on Mar. 23, 2018, which in turn claims priority to Chinese Patent Application No. 201710363929.4 filed on May 22, 2017, the entire disclosures of which are incorporated herein by reference.

TECHNICAL FIELD

The present disclosure relates to a display panel and a display apparatus.

BACKGROUND

In recent years, the Organic Light-Emitting Diode (OLED) becomes an emerging flat display product that is very hot at home and abroad. Current OLED display panels have typically a rigid structure, wherein the Thin Film Transistor (TFT) circuit is made on a substrate glass and is packaged with a Frit and a packaging cover plate glass. During printing, the Frit is spaced a gap from an edge of the TFT substrate glass and the packaging cover plate glass and cannot be overspread on metal lines which are made on the TFT substrate glass, and a portion of the metal lines are exposed from the Frit. When an antistatic ability test is carried out for the OLED display panel, Electro-Static discharge (ESD) easily takes place on the metal lines along the gap between the TFT substrate glass and the packaging cover plate glass, and even static electricity is guided into the interior of the panel to burn out the TFT circuit, thus resulting in an abnormal display of the OLED display panel.

SUMMARY

The present disclosure discloses a display panel, comprising: a substrate which comprises a substrate display region corresponding to a display panel display region and a substrate non-display region corresponding to a display panel non-display region; a non-display region circuit which is located at the substrate non-display region; and a packaging layer which is located on the non-display region circuit and has an area at least partially overlapping with the non-display region circuit, wherein the non-display region circuit comprises: a first conductive pattern; at least one buffer layer which is located at a side of the first conductive pattern close to the substrate; at least one gate insulating layer which is configured to electrically insulate the first conductive pattern and other conductive patterns; and at least one interlayer insulating layer which is located at a side of the first conductive pattern away from the substrate.

According to some embodiments of the disclosure, the packaging layer comprises a frit.

According to some embodiments of the disclosure, the display panel further comprises: a display region circuit located at the substrate display region, wherein the display region circuit comprises a thin film transistor which comprises a gate, a source, a drain and an active layer, and wherein the first conductive pattern and the gate are located at a same layer and have same material.

According to some embodiments of the disclosure, the at least one interlayer insulating layer is located between the packaging layer and the first conductive pattern, and the at least one interlayer insulating layer comprises at least one first through-hole, and at least a part of the packaging layer is located in the at least one first through-hole.

According to some embodiments of the disclosure, the display panel further comprises: a display device which is located at the substrate display region, wherein the display device comprises a plurality of pixel units and a pixel defining layer, each of the plurality of pixel units comprises a first electrode electrically connected to the thin film transistor, and the pixel defining layer is configured to define the plurality of pixel units, wherein the non-display region circuit further comprises a peripheral wiring, a first electrode pattern and a pixel defining pattern which are located on the interlayer insulating layer, wherein the peripheral wiring comprises a VSS power line, the first electrode pattern and the first electrode are located at a same layer and have same material, and the pixel defining pattern and the pixel defining layer are located at a same layer and have same material.

According to some embodiments of the disclosure, an end of the peripheral wiring close to an outer edge of the display panel is closer to the outer edge of the display panel than an end of the pixel defining pattern close to the outer edge of the display panel; another end of the peripheral wiring away from the outer edge of the display panel is substantially flush with another end of the pixel defining pattern away from the outer edge of the display panel; and the first electrode pattern is electrically connected to the peripheral wiring.

According to some embodiments of the disclosure, an end of the peripheral wiring close to an outer edge of the display panel is closer to the outer edge of the display panel than an end of the pixel defining pattern close to the outer edge of the display panel; another end of the pixel defining pattern away from the outer edge of the display panel is farther away from the outer edge of the display panel than another end of the peripheral wiring away from the outer edge of the display panel; and the first electrode pattern is electrically connected to the peripheral wiring.

According to some embodiments of the disclosure, the at least one buffer layer comprises at least a first buffer layer and a second buffer layer, wherein the first buffer layer is closer to the first conductive pattern than the second buffer layer, and a thickness of the first buffer layer is greater than that of the second buffer layer.

According to some embodiments of the disclosure, the at least one interlayer insulating layer comprises at least a first interlayer insulating layer and a second interlayer insulating layer, wherein the first interlayer insulating layer is closer to the first conductive pattern than the second interlayer insulating layer, and a thickness of the first interlayer insulating layer is greater than that of the second interlayer insulating layer.

According to some embodiments of the disclosure, the first conductive pattern comprises at least one second through-hole.

According to some embodiments of the disclosure, the at least one gate insulating layer comprises a first gate insulating layer which is located at a side of the first conductive pattern away from the substrate; and portions of the at least one interlayer insulating layer and the first gate insulating layer at a position corresponding to the at least one second through-hole of the first conductive pattern are removed, so that the packaging layer is able to be in contact with at least one of the at least one buffer layer through the at least one second through-hole.

According to some embodiments of the disclosure, a plurality of third through-holes are provided in the at least one interlayer insulating layer and the first gate insulating layer at the position corresponding to the at least one second through-hole of the first conductive pattern, so that the packaging layer is able to be in contact with at least one of the at least one buffer layer through the plurality of third through-holes and the at least one second through-hole, wherein a maximum aperture of the third through-holes is smaller than that of the second through-hole.

According to some embodiments of the disclosure, the at least one gate insulating layer further comprises a second gate insulating layer which is located between the first conductive pattern and the at least one buffer layer.

According to some embodiments of the disclosure, a portion of the second gate insulating layer at the position corresponding to the at least one second through-hole of the first conductive pattern is removed, so that the packaging layer is able to be in contact with at least one of the at least one buffer layer through the at least one second through-hole.

According to some embodiments of the disclosure, a plurality of third through-holes are provided in the second gate insulating layer at the position corresponding to the at least one second through-hole of the first conductive pattern, so that the packaging layer is able to be in contact with at least one of the at least one buffer layer through the at least one second through-hole and the plurality of third through-holes.

According to some embodiments of the disclosure, the packaging layer is provided symmetrically on a left side and a right side of the display panel, and is provided asymmetrically on an upper side and a lower side of the display panel.

According to some embodiments of the disclosure, the display panel further comprises a crack detection line which is located between the non-display region circuit and an outer edge of the display panel.

According to some embodiments of the disclosure, the display panel further comprises a cover plate, wherein the cover plate and the substrate are oppositely provided and form package sides by edge packaging or notch packaging.

According to some embodiments of the disclosure, the display panel further comprises a protective layer which is located at the package sides and is far away from the packaging layer.

According to some embodiments of the disclosure, a gap is present between the protective layer and the packaging layer.

According to some embodiments of the disclosure, the material of the protective layer is different from the material of the packaging layer.

According to some embodiments of the disclosure, the packaging layer comprises a frit.

According to some embodiments of the disclosure, the material of the protective layer is same as the material of the packaging layer.

To solve the aforementioned problem, the present disclosure further discloses a display apparatus, the display apparatus comprising the aforementioned display panel.

DESCRIPTIONS OF DRAWINGS

DETAILED DESCRIPTION

To make the aforementioned objective, features and advantages of the present disclosure more obvious and comprehensive, a further explanation is made in detail for the present disclosure in combination with the drawings and the embodiments.

Figure 1:
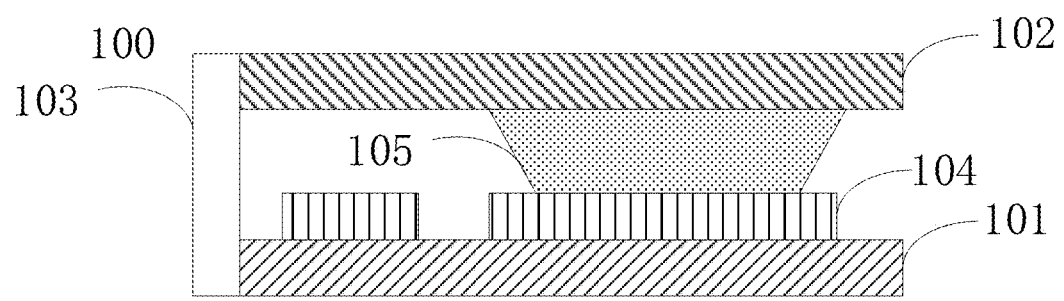
FIG. 1 illustrates a cross-sectional schematic diagram of the display panel according to some embodiments of the present disclosure.

FIG. 1 illustrates a cross-sectional schematic diagram of a display panel 100 according to some embodiments of the present disclosure. As shown in FIG. 1, the display panel 100 may comprise a substrate 101 and a cover plate 102 which are oppositely provided, and at least a portion of a periphery or a side formed by the substrate 101 and the cover plate 102 is attached with a protective layer 103 to seal a corresponding portion of a gap between the substrate 101 and the cover plate 102.

FIG. 1 only illustrates that a left portion of the periphery or the side formed by the substrate 101 and the cover plate 102 is attached with a protective layer 103 to seal the corresponding portion of the gap between the substrate 101 and the cover plate 102. However, those skilled in the art can understand that, more portions or even all portions of the periphery or the side formed by the substrate 101 and the cover plate 102 may be attached with a protective layer 103 to seal the corresponding portion of the gap between the substrate 101 and the cover plate 102.

For example, in some embodiments, the periphery or the side formed by the substrate 101 and the cover plate 102 includes a circuit connection side and a package side, wherein only the package side is attached with the protective layer 103 to seal the corresponding portion of the gap between the substrate 101 and the cover plate 102.

Figure 2:
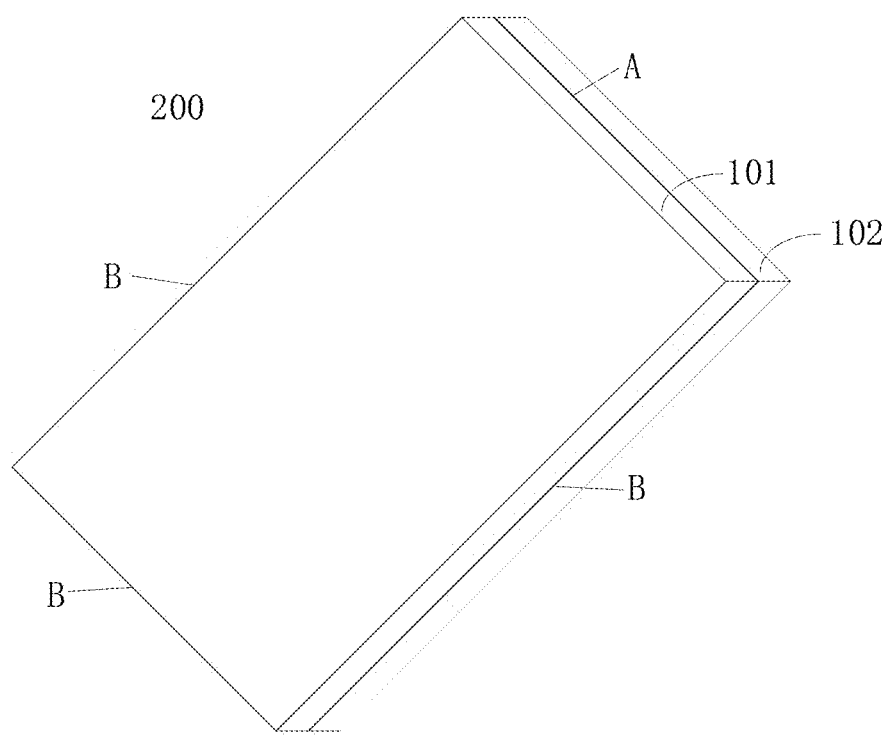
FIG. 2 illustrates an exemplary perspective schematic diagram of the display panel according to some embodiments of the present disclosure.

FIG. 2 illustrates an exemplary perspective schematic diagram of a display panel 200 according to some embodiments of the present disclosure. As shown in FIG. 2, the periphery or the side formed by the substrate 101 and the cover plate 102 may include three package sides B and one circuit connection side A. As described above, all the package sides B may be attached with the protective layer 103 which seals the corresponding portion of the gap between the substrate 101 and the cover plate 102, such that static electricity cannot be discharged from the gap between the substrate 101 and the cover plate 102 to a circuit 104 of the display panel, thus improving an antistatic ability of the display panel.

Those skilled in the art may understand that, the arrangement of the package side and the circuit connection side may be adjusted according to actual needs.

In some embodiments of the present disclosure, one end surface of the protective layer 103 is flush with an outer surface of the cover plate 101, and the other end surface of the protective layer 103 is flush with an outer surface of the substrate 102. For example, as shown in FIG. 1, both the upper and lower ends of the protective layer 103 are flush with the outer surface of the cover plate 101 and the outer surface of the substrate 102, respectively.

If the protective layer 103 forms projections on the outer surfaces of the cover plate 102 and the substrate 102, when the display panel is attached with other parts, the projections formed by the protective layer 103 may possibly affect a tightness degree of attachment of the other parts, which results in a situation of an untight attachment. In the present embodiment, with reference to the cross-sectional schematic diagram of the display panel as shown in FIG. 1, both ends of the protective layer 103 are flush with the outer surfaces of the cover plate 102 and the substrate 101, and no projections will be formed on the outer surfaces of the cover plate 102 and the substrate 101. Accordingly, a tight attachment may be implemented when the other parts are attached.

In some embodiments of the present disclosure, a material of the protective layer 103 is a soft material which is insulated and waterproof. The insulating material may prevent static electricity from being discharged from the gap between the substrate 101 and the cover plate 102 to the circuit of the display panel, and improve an antistatic ability of the display panel. The waterproof material may prevent water from entering the gap between the substrate 101 and the cover plate 102, and avoid a failure of the display panel due to water entrance. The soft material may protect the sides of the substrate 101 and the cover plate 102 when the display panel collides with a metal frame, prevent the substrate 101 and the cover plate 102 from being damaged, and improve a mechanical strength of the display panel.

In some embodiments of the present disclosure, the protective layer 103 is a Polyethylene terephthalate (PET) film. The PET film has many advantages as follows: it has excellent physical mechanical properties in a broad temperature range, a long-term service temperature up to 120° C., and a good creep resistance, fatigue durability, abrasion resistance, dimensional stability at a high temperature and a high frequency; it has an excellent electrical insulation; it has a low permeability of gas and water vapor, excellent properties of resistance to gas, water, oil, and odor; it has an impact resistance strength which is 3 to 5 times that of other films, a good folding endurance, and excellent mechanical properties. Therefore, the PET film is a preferable soft material which is insulated and waterproof.

In some embodiments of the present disclosure, a thickness between both ends of the protective layer 103 may be, for example, 0.5 mm to 0.6 mm. The thickness of the protective layer 103 is determined by thicknesses of the substrate 102, the cover plate 102 and the gap between the substrate 101 and the cover plate 102, and is 0.5 mm to 0.6 mm under normal circumstances.

In some embodiments of the present disclosure, the display panel further comprises a Thin Film Transistor (TFT) circuit 104 arranged on the substrate 102, and the cover plate 102 is adhered to the TFT circuit 104 by a Frit 105. The Frit has a strong ability of resistance to water and oxygen. By means of adhering the cover plate 102 to the TFT circuit 104 by a Frit 105, the package process is simple and is easily implemented, and it is possible to protect most Thin Film Transistor (TFT) circuits of the display panel.

Figure 3:
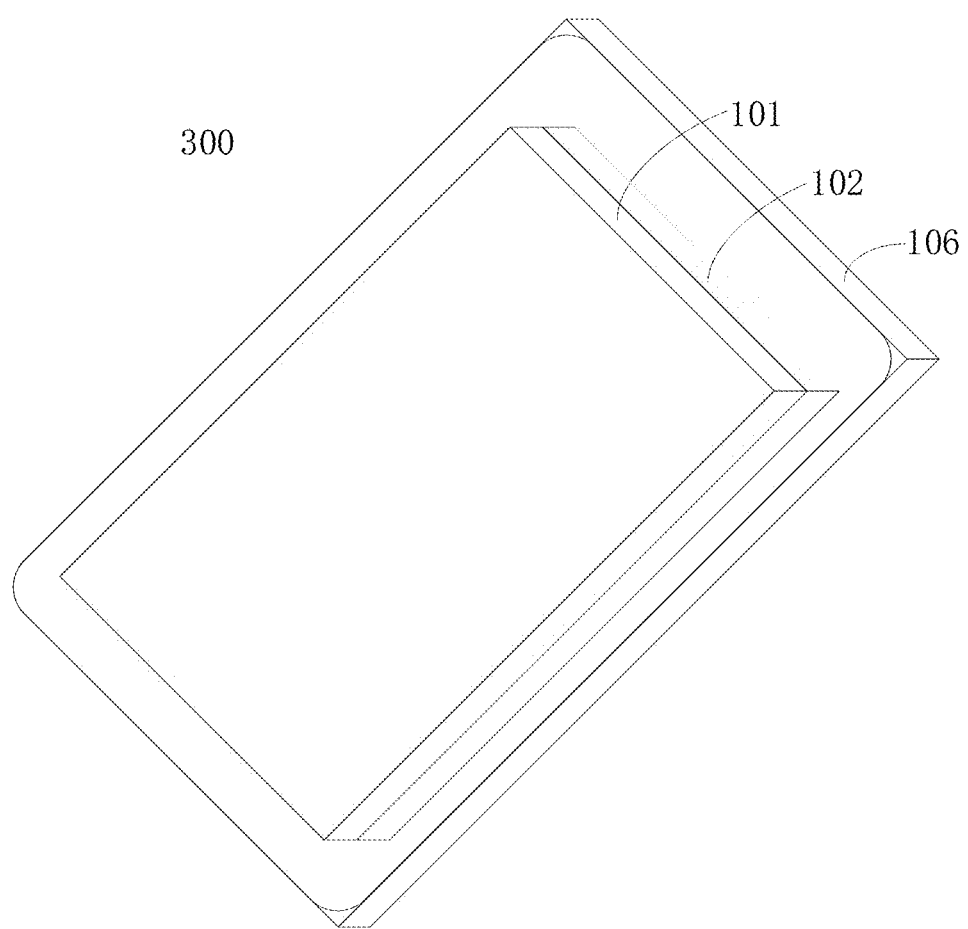
FIG. 3 illustrates an exemplary perspective schematic diagram of the display panel according to some embodiments of the present disclosure.

FIG. 3 illustrates an exemplary perspective schematic diagram of a display panel 300 according to some embodiments of the present disclosure. As shown in FIG. 3, it is different from the display panels 100 and 200 as shown in FIGS. 1 and 2 in that, the display panel 300 further includes a panel glass 106 which is attached to the cover plate 102.

Referring to the perspective schematic diagram of the display panel as illustrated in FIG. 3, the panel glass 106 is attached to the cover plate 102 to protect the cover plate 102. The protective layer 103 may be attached after the panel glass 106 is attached to the cover plate 102, which avoids an untight attachment of the panel glass 106 and the cover plate 102 caused by the prior attachment of the protective layer 103.

To sum up, in embodiments of the present disclosure, at least a portion of the side of the display panel is attached with the protective layer to seal the gap between the substrate and the cover plate, such that static electricity cannot be discharged from the gap between the substrate and the cover plate to the Thin Film Transistor (TFT) circuit of the display panel, thus improving an antistatic ability of the display panel.

Further, the protective layer protects the side of the cover plate and the substrate, such that the display panel is not easily damaged when colliding with the metal frame, and a mechanical strength of the display panel is improved.

Figure 4:
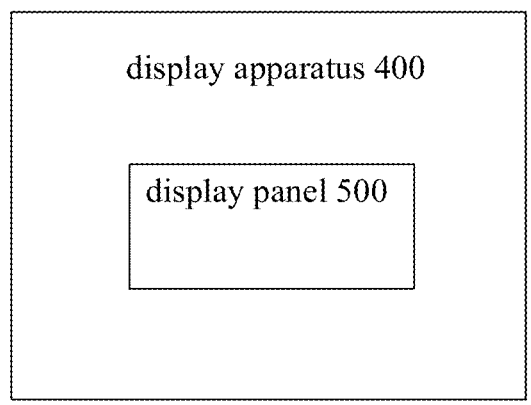
FIG. 4 illustrates an exemplary structural diagram of the display apparatus according to some embodiments of the present disclosure.

FIG. 4 illustrates an exemplary structural diagram of a display apparatus 400 according to some embodiments of the present disclosure. As shown in FIG. 4, the display apparatus 400 comprises the aforementioned display panel 500 according to the embodiment of the present disclosure. The display panel 500 is, for example, the display panel 100, 200 or 300 as shown in FIGS. 1-3.

The display panel 400 may include, but not limited to, liquid crystal panel, electronic paper, OLED panel, mobile phone, tablet computer, TV set, display, laptop, digital photo frame, navigator, and any other product or part having a display function.

To sum up, at least a portion of the side of the display panel according to the embodiment of the present disclosure is attached with the protective layer to seal the gap between the substrate and the cover plate, such that static electricity cannot be discharged from the gap between the substrate and the cover plate to the circuit of the display panel, thus improving an antistatic ability of the display panel.

In some embodiments, the protective layer protects the side of the cover plate and the substrate, such that the display panel is not easily damaged when colliding with the metal frame, and a mechanical strength of the display panel is improved.

Figure 5A:
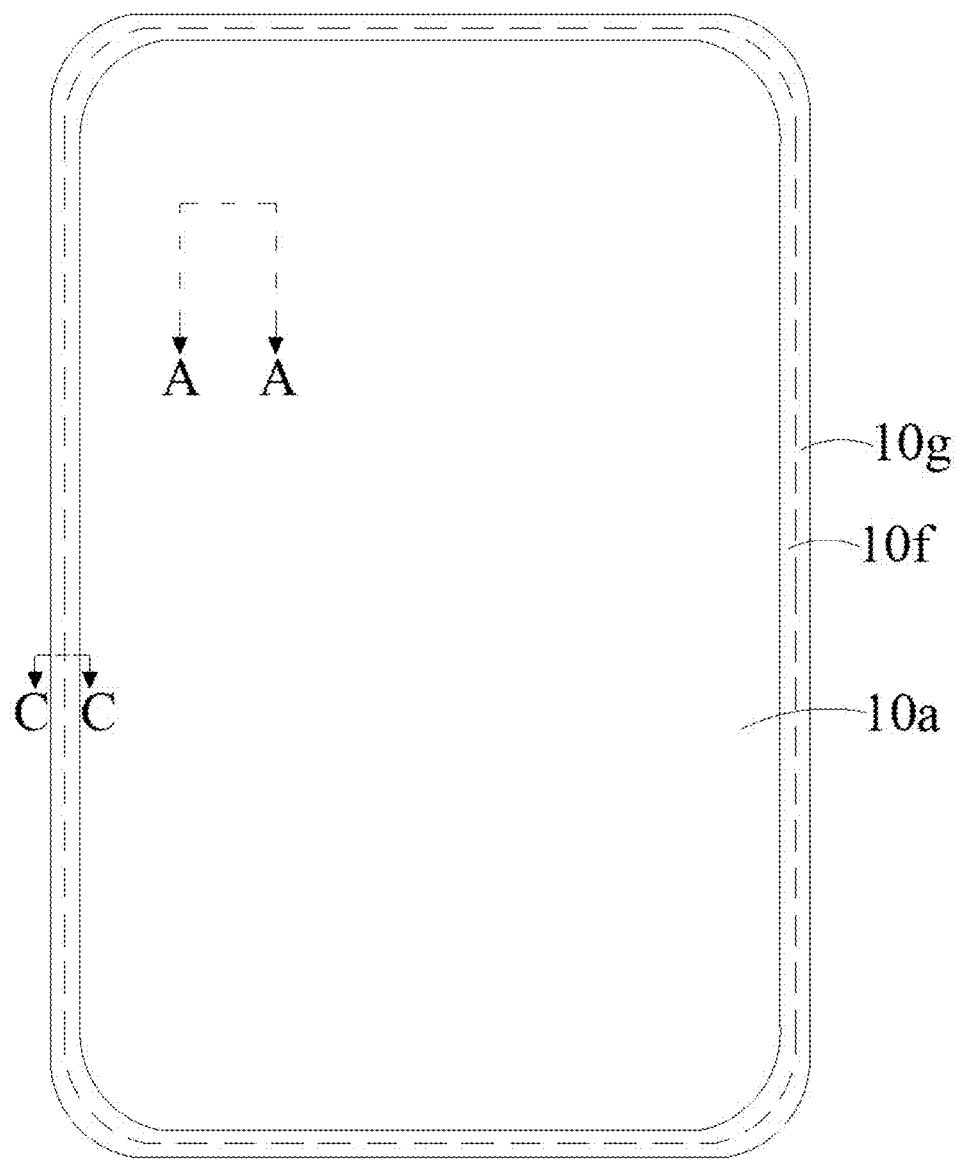
FIG. 5A illustrates a schematic plan view of the display panel according to some embodiments of the present disclosure.

An embodiment of the present disclosure provides a display panel which may be an OLED display panel. FIG. 5A illustrates a schematic plan view of a display panel according to some embodiments of the present disclosure. As shown in FIG. 5A, the display panel 10 may have a display region 10a. It should be noted that the display panel 10 may further comprise a peripheral wiring region 10f and a peripheral packaging region 10g. The peripheral wiring region 10f may be arranged around the display region 10a, or may be arranged on both sides of the display region 10a. The peripheral packaging region 10g may be located at the outermost edge of the entire substrate 101 to package the entire display panel 10. The display region 10a, the peripheral wiring region 10f and the peripheral packaging region 10g as shown in FIG. 5A all have a substantially rectangular shape.

Figure 5B:
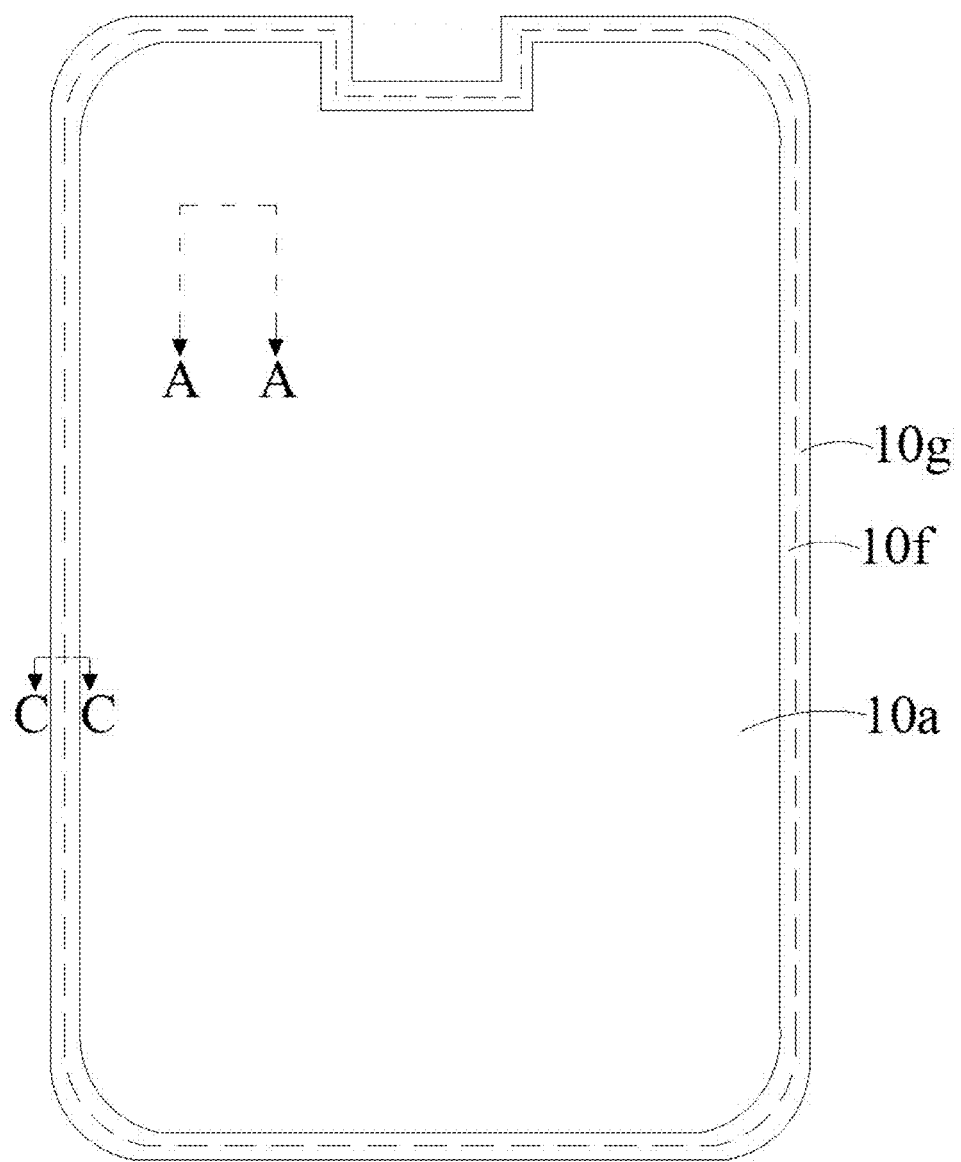
FIG. 5B illustrates a schematic plan view of another display panel according to some embodiments of the present disclosure.

In addition, FIG. 5B illustrates a schematic plan view of another display panel according to some embodiments of the present disclosure. The main difference between FIG. 5B and FIG. 5A is in that the display region 10a, the peripheral wiring region 10f and the peripheral packaging region 10g as shown in FIG. 5A have a notch in one of the four sides (for example, the upper side).

Figure 6:
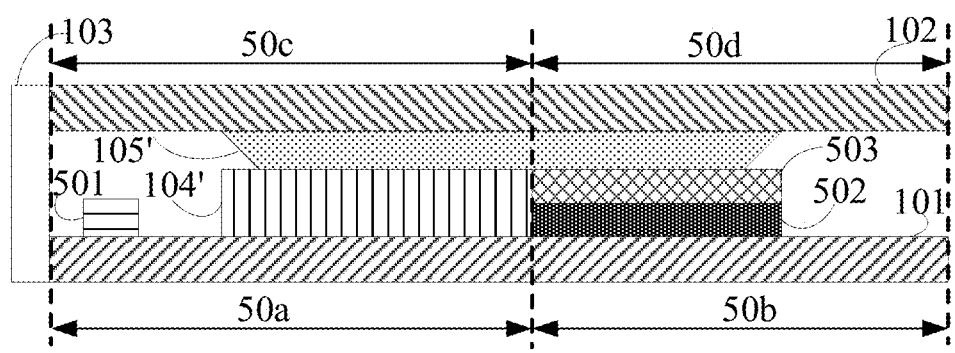
FIG. 6 illustrates a schematic cross-sectional view of the display panel according to some embodiments of the present disclosure.

FIG. 6 illustrates a schematic cross-sectional view of a display panel according to some embodiments of the present disclosure. As shown in FIG. 6, the display panel may comprise a display panel non-display region 50c and a display panel display region 50d. According to some embodiments of the present disclosure, the display panel may further comprise a substrate 101. As shown in FIG. 6, the substrate 101 may comprise a substrate display region 50b corresponding to the display panel display region 50d and a substrate non-display region 50a corresponding to the display panel non-display region 50c. According to some embodiments of the present disclosure, the display panel may further comprise a non-display region circuit 104'. As shown in FIG. 6, the non-display region circuit 104' may be located at the substrate non-display region 50a, and may be configured to provide signals to the display panel. The details of the non-display region circuit 104' will be described below.

In some embodiments, the non-display region circuit may be configured not to provide signals to the display panel.

According to some embodiments of the present disclosure, the display panel may further comprise a packaging layer 105'. As shown in FIG. 6, the packaging layer 105' may be located at the non-display region circuit 104', and may have an area at least partially overlapping with the non-display region circuit 104'.

According to some embodiments of the present disclosure, as shown in FIG. 5A, the packaging layer 105' may be symmetrically provided at a left side and a right side of the display panel, and symmetrically provided at an upper side and a lower side of the display panel.

In addition, according to some embodiments of the present disclosure, as shown in FIG. 5B, the packaging layer 105' may be symmetrically provided on the left side and the right side of the display panel, and asymmetrically provided on the upper side and the lower side of the display panel.

According to some embodiments of the present disclosure, the packaging layer 105' may comprise a frit. Since the first conductive pattern 602 has a high reflectivity, the curing rate of the frit can be improved when the frit is cured.

According to some embodiments of the present disclosure, the display panel may further comprise a crack detection line 501. As shown in FIG. 6, the crack detection line 501 may be located between the non-display region circuit 104' and the outer edge of the display panel. According to some embodiments of the present disclosure, the crack detection line 501 may be provided around the periphery of the display panel, and may be configured to detect whether there are cracks on the periphery of the display panel.

According to some embodiments of the present disclosure, the display panel may further comprise a cover plate 102. As shown in FIG. 6, the cover plate 102 and the substrate 101 may be oppositely provided, and the package sides may be formed by edge packaging (as shown in FIG. 5A) or notch packaging (as shown in FIG. 5B).

According to some embodiments of the present disclosure, the display panel may further comprise a protective layer 103. As shown in FIG. 6, the protective layer 103 may be located at the package side and may be away from the packaging layer 105'. In addition, as shown in FIG. 6, a gap may be present between the protective layer 103 and the packaging layer 105'. According to some embodiments of the present disclosure, the material of the protective layer 103 may be different from the material of the packaging layer 105'. In addition, according to some embodiments of the present disclosure, the material of the protective layer 103 may also be the same as the material of the packaging layer 105'. According to some embodiments of the present disclosure, the material of the protective layer 103 is UV-curing adhesive, and the material of the packaging layer 105' is frit. According to some embodiments of the present disclosure, the materials of both the protective layer 103 and the packaging layer 105' are the frit. In some embodiments, the fit comprises inorganic materials, and the UV-curing adhesive comprises organic materials, and the two materials are different.

According to some embodiments of the present disclosure, the display panel may further comprise a display region circuit 502. As shown in FIG. 6, the display region circuit 502 may be located at the substrate display region 50b. The details of the display region circuit 502 will be described below.

According to some embodiments of the present disclosure, the display panel may further comprise a display device 503. As shown in FIG. 6, the display device 503 may be located at the substrate display region 50b, and may have an area at least partially overlapping with the display region circuit 502. The details of the display device 503 will be described later.

Figure 7:
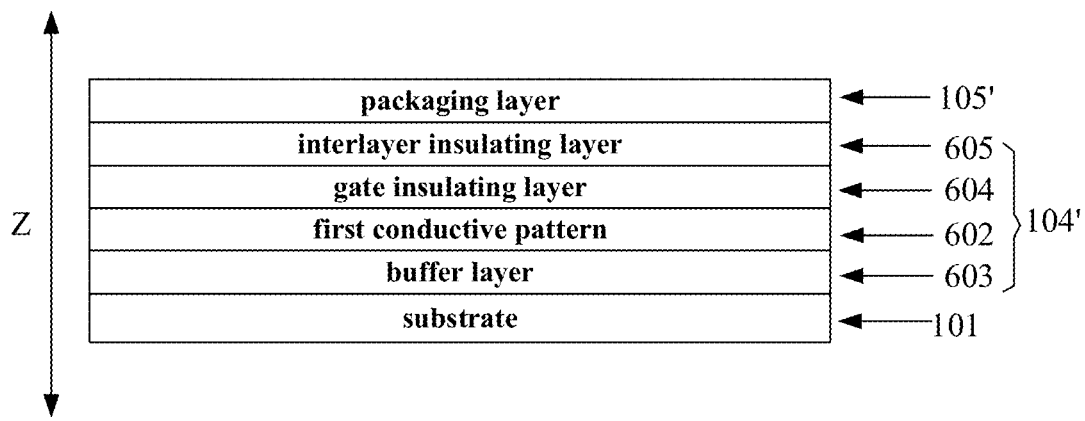
FIG. 7 illustrates a schematic cross-sectional view of a structure of a non-display region circuit according to some embodiments of the present disclosure.

FIG. 7 illustrates a schematic cross-sectional view of the structure of the non-display region circuit 104' according to some embodiments of the present disclosure. According to some embodiments of the present disclosure, the non-display region circuit 104' may comprise a first conductive pattern 602, at least one buffer layer 603, at least one gate insulating layer 604, and at least one interlayer insulating layer 605. As shown in FIG. 7, the at least one buffer layer 603 may be located at a side of the first conductive pattern 602 close to the substrate 101. That is, the at least one buffer layer 603 may be located between the first conductive pattern 602 and the substrate 101. In addition, the at least one gate insulating layer 604 may be configured to electrically insulate the first conductive pattern 602 and other conductive patterns. In some embodiments, the at least one gate insulating layer 604 may be located at a side of the first conductive pattern 602 close to the substrate 101 and/or a side of the first conductive pattern 602 away from the substrate 101.

As shown in FIG. 7, the at least one gate insulating layer 604 may be located at a side of the first conductive pattern 602 away from the substrate 101. That is, the at least one gate insulating layer 604 may be located between the first conductive pattern 602 and the at least one interlayer insulating layer 605. Alternatively, the at least one gate insulating layer 604 may also be located at a side of the first conductive pattern 602 close to the substrate 101 (not shown). That is, the at least one gate insulating layer 604 may also be located between the first conductive pattern 602 and the at least one buffer layer 603 (not shown). In addition, the at least one interlayer insulating layer 605 may be located at a side of the first conductive pattern 602 away from the substrate 101. That is, the at least one interlayer insulating layer 605 may be located between the packaging layer 105' and the first conductive pattern 602.

As a result, as shown in FIG. 7, the non-display region circuit 104' may comprise the at least one buffer layer 603, the first conductive pattern 602, the at least one gate insulating layer 604, and the at least one interlayer insulating layer 605 in an order from the substrate 101 to the packaging layer 105'. In some embodiments, the non-display region circuit 104' may also comprise the at least one buffer layer 603, the at least one gate insulating layer 604, the first conductive pattern 602, the at least one gate insulating layer 604, and at least one interlayer insulating layer 605 in an order from the substrate 101 to the packaging layer 105'.

Figure 8:
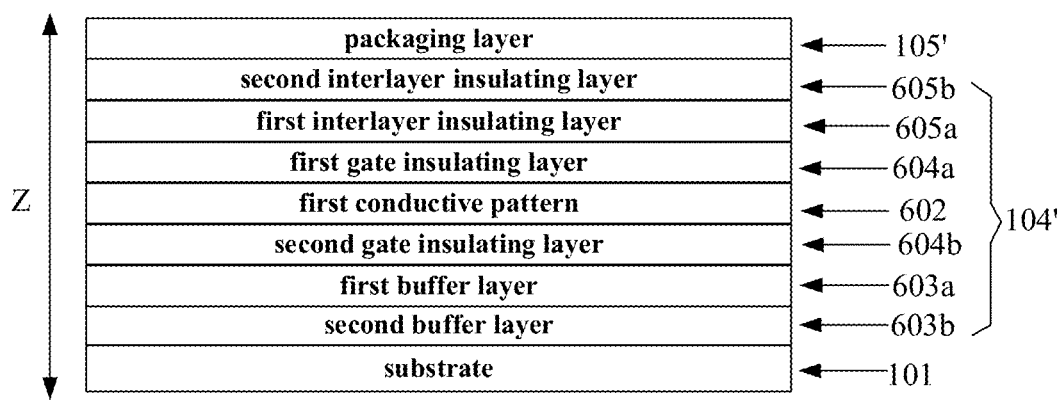
FIG. 8 illustrates a schematic cross-sectional view of another structure of the non-display region circuit according to some embodiments of the present disclosure.

FIG. 8 illustrates a schematic cross-sectional view of another structure of the non-display region circuit 104' according to some embodiments of the present disclosure. According to some embodiments of the present disclosure, as shown in FIG. 8, the at least one buffer layer 603 may comprise at least a first buffer layer 603a and a second buffer layer 603b, wherein the first buffer layer 603a may be closer to the first conductive pattern 602 than the second buffer layer 603b, and the thickness of the first buffer layer 603a may be greater than that of the second buffer layer 603b.

According to some embodiments of the present disclosure, as shown in FIG. 8, the at least one interlayer insulating layer 605 may comprise at least a first interlayer insulating layer 605a and a second interlayer insulating layer 605b, wherein the first interlayer insulating layer 605a may be closer to the first conductive pattern 602 than the second interlayer insulating layer 605b, and the thickness of the first interlayer insulating layer 605a may be greater than that of the second interlayer insulating layer 605b.

According to some embodiments of the present disclosure, as shown in FIG. 8, the at least one gate insulating layer 604 may comprise a first gate insulating layer 604a and a second gate insulating layer 604b. The first gate insulating layer 604a may be located at a side of the first conductive pattern 602 away from the substrate 101. That is, the first gate insulating layer 604a may be located between the first conductive pattern 602 and the at least one interlayer insulating layer 605. The second gate insulating layer 604b may be located between the first conductive pattern 602 and the at least one buffer layer 603. That is, the second gate insulating layer 604b may be located at a side of the first conductive pattern 602 close to the substrate 101.

As a result, as shown in FIG. 8, the non-display region circuit 104' may comprise the second buffer layer 603b, the first buffer layer 603a, the second gate insulating layer 604b, the first conductive pattern 602, the first gate insulating layer 604a, the first interlayer insulating layer 605a, and the second interlayer insulating layer 605b in an order from the substrate 101 to the packaging layer 105'.

Figure 9:
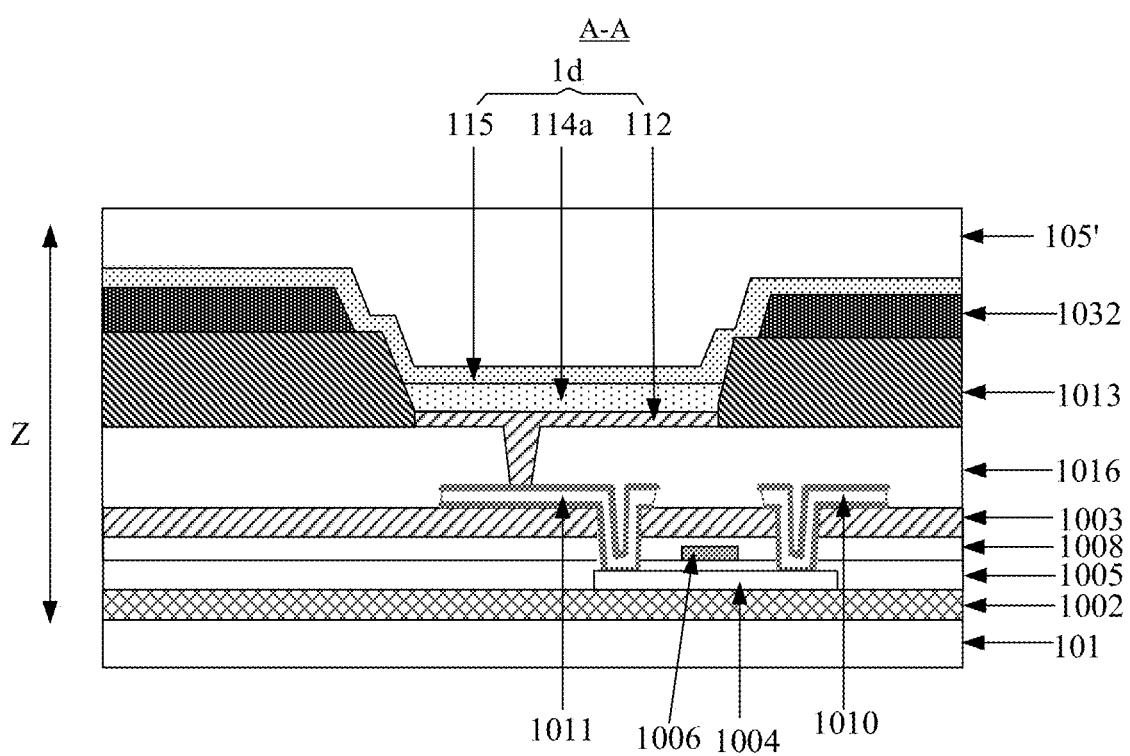
FIG. 9 illustrates a schematic cross-sectional view of the display panel in the direction A-A according to the embodiment as shown in FIG. 5A or FIG. 5B.

FIG. 9 illustrates a schematic cross-sectional view of the display panel in the direction A-A according to the embodiment as shown in FIG. 5A or FIG. 5B. According to some embodiments of the present disclosure, the display region circuit 502 may comprise a thin film transistor. As shown in FIG. 9, the thin film transistor may comprise a gate 1006, a source 1010, a drain 1011, and an active layer 1004. In addition, the thin film transistor may further comprise an interlayer dielectric layer 1003, a third gate insulating layer 1008, and a fourth gate insulating layer 1005. Specifically, the active layer 1004 may be formed on the buffer layer 1002, the fourth gate insulating layer 1005 may cover the buffer layer 1002 and the active layer 1004, and the gate 1006 may be formed at a side of the fourth gate insulating layer 1005 away from the active layer 1004. The third gate insulating layer 1008 may cover the gate 1006 and the fourth gate insulating layer 1005, the interlayer dielectric layer 1003 may cover the third gate insulating layer 1008, and the source 1010 and the drain 1011 may be formed at a side of the interlayer dielectric layer 1003 away from the substrate 101 and may be located at opposite sides of the gate 1006. The source 1010 and the drain 1011 may be in contact with opposite sides the active layer 1004 through via-holes (for example, metal via-holes), respectively. Note that the thin film transistor may be a top gate type or may be a bottom gate type.

According to some embodiments of the present disclosure, the first conductive pattern 602 and the gate 1006 of the thin film transistor may be located at the same layer and have the same material.

According to some embodiments of the present disclosure, the buffer layer 1002 may be at least one layer, and the buffer layer 1002 and each of the at least one buffer layer 603 may be located at the same layer and have the same material.

According to some embodiments of the present disclosure, the fourth gate insulating layer 1005 and the second gate insulating layer 604b are located at the same layer and have the same material.

According to some embodiments of the present disclosure, the third gate insulating layer 1008 and the first gate insulating layer 604a are located at the same layer and have the same material.

According to some embodiments of the present disclosure, the interlayer dielectric layer 1003 may be at least one layer, and the interlayer dielectric layer 1003 and each of the at least one interlayer insulating layer 605 are located at the same layer and have the same material.

According to some embodiments of the present disclosure, as shown in FIG. 9, the display device 503 may comprise a plurality of pixel units 1d and a pixel defining layer 1013, wherein each of the plurality of pixel units 1d may comprise a first electrode 112 electrically connected to the thin film transistor, and the pixel defining layer 1013 may be configured to define a plurality of pixel units 1d. As shown in FIG. 9, the first electrode 112 and the pixel defining layer 1013 may be formed on the interlayer dielectric layer 1003 in sequence. Note that the pixel unit 1d may further comprise a light-emitting part 114a and a second electrode 115.

For example, when the thin film transistor in the display region 10a is of the top gate type, a planarization layer can be fabricated before the display device is fabricated. The planarization layer can be a single-layer structure or a multilayer structure. The planarization layer is usually made of organic materials, such as photoresist, acrylic-based polymer, silicon-based polymer and other materials. As shown in FIG. 9, the planarization layer may comprise a planarization portion 1016 located at the display region 10a, and the planarization portion 1016 may be formed between the interlayer dielectric layer 1003 and the first electrode 112. The first electrode 112 can be electrically connected to the drain 1011 through the metal via-hole. The first electrode 112 can be an anode which can be made of materials such as ITO (Indium Tin Oxide), Indium Zinc Oxide (IZO), Zinc Oxide (ZnO) or the like. The pixel defining layer 1013 can cover the planarization portion 1016. The pixel defining layer 1013 can be made of organic materials such as photoresist or other organic materials, and the portion of the pixel defining layer 1013 located at the display region 10a can have the pixel opening through which the first electrode 112 is exposed. The light-emitting portion 114a may be located within the pixel opening and formed on the first electrode 112. The light-emitting portion 114a may comprise small molecular organic materials or polymer molecular organic materials, which may be fluorescent light-emitting materials or phosphorescent light-emitting materials, and may emit red light, green light, blue light, or may emit white light. In addition, according to different actual needs, in different examples, the light-emitting portion 114a may further comprise functional layers such as an electron injection layer, an electron transport layer, a hole injection layer, a hole transport layer or the like. The second electrode 115 may cover the light-emitting part 114a, and the polarity of the second electrode 115 is opposite to that of the first electrode 112. The second electrode 115 may be a cathode which may be made of metal materials such as lithium (Li), aluminum (Al), magnesium (Mg), silver (Ag) or the like.

As shown in FIG. 9, the first electrode 112, the light-emitting part 114a and the second electrode 115 may constitute one light-emitting sub-pixel 1d. The portion of the display device located at the display region 10a may comprise a plurality of light-emitting sub-pixels 1d arranged in an array. In addition, note that the first electrode 112 of each of the light-emitting sub-pixels 1d is independent of each other, and the second electrode 115 of each of the light-emitting sub-pixels 1d is connected over the entire surface. In other words, the second electrode 115 is a whole-surface structure provided on the display panel 10, and is a common electrode for the plurality of display devices.

In some embodiments, as shown in FIG. 9, a side of the pixel defining layer 1013 away from the interlayer dielectric layer 1003 may further be provided with a supporting portion 1032, which may function to support the protective film layer (not shown in the figure) to prevent the protective film layer from contacting the first electrode 112 or other wirings, which may cause the first electrode 112 or other wirings to be easily damaged.

In some embodiments, the display panel may comprise another conductive pattern between the drain 1011 and the first electrode 112. The display panel may comprises another planarization portion between the drain 1011 and the first electrode 112. The another conductive pattern electrically connects the drain 1011 and the first electrode 112 through via-holes in the another planarization portion, that is the another conductive pattern electrically connected with the drain 101 through via-holes in the another planarization portion and electrically connected with the first electrode 11 through via-holes in the planarization portion 1016.

In some embodiments, the non-display region circuit 104' further comprises another VSS power line in the same layer and has a same material with the another conductive pattern. The another VSS power line coupled with the VSS power line and the first electrode pattern.

In some embodiments, the display panel may comprise a passivation layer (PVX) between the planarization portion 1016 and the interlayer dielectric layer 1003.

In addition, when the display panel 10 has a peripheral wiring region 10f, the pixel defining layer 1013 is also located at the peripheral wiring region 10f.

In some embodiments, the planarization layer may also be formed at the peripheral wiring region 10f. In some embodiments, a planarization pattern, which is located at the same layer as the planarization layer, may be further comprised between the second interlayer insulating layer 605b and the packaging layer 105'.

Figure 10A:
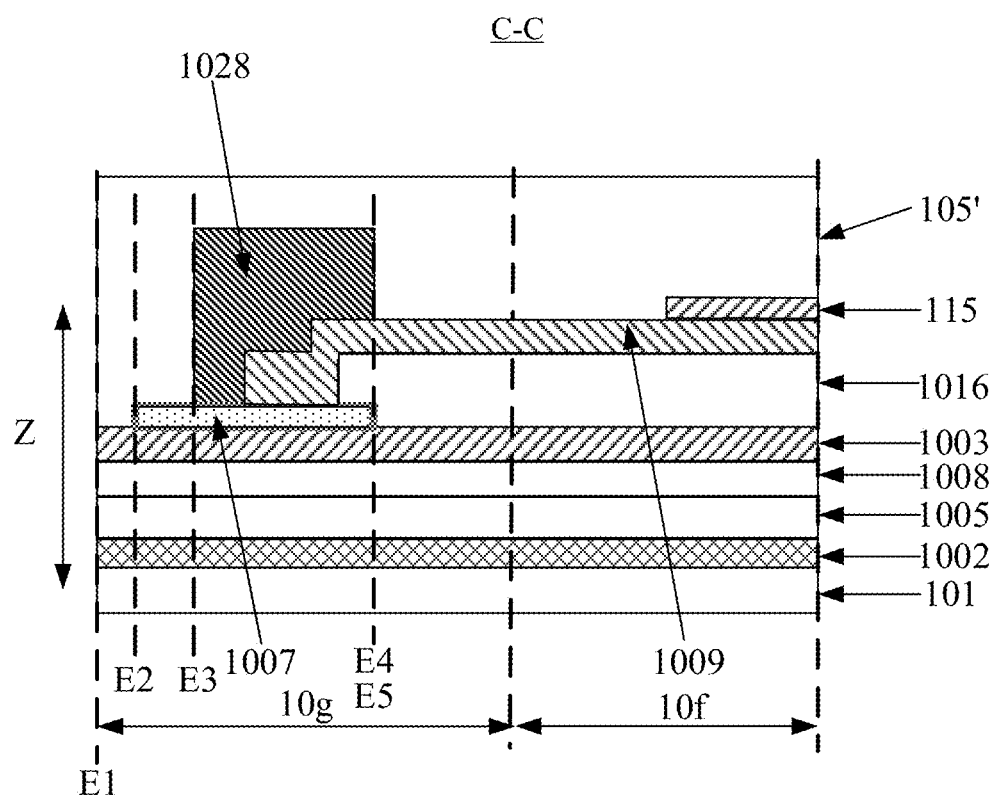
FIG. 10A illustrates a schematic cross-sectional view of the display panel in the direction C-C according to the embodiment as shown in FIG. 5A or FIG. 5B.
Figure 10B:
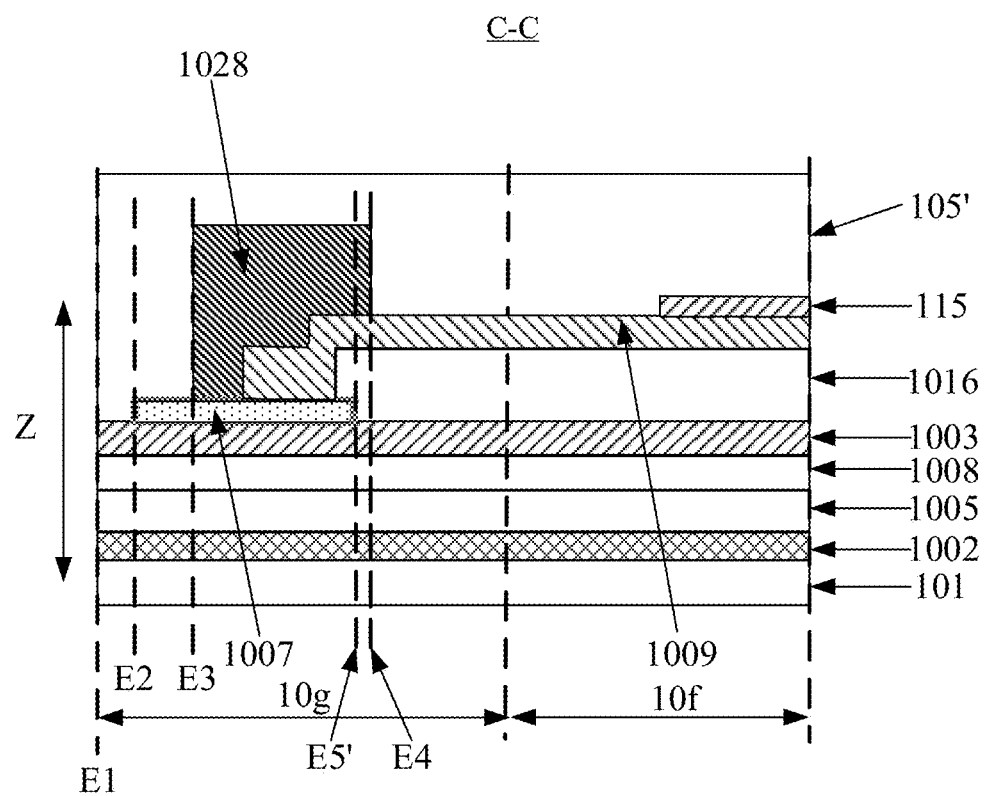
FIG. 10B illustrates another schematic cross-sectional view of the display panel in the direction C-C according to the embodiment as shown in FIG. 5A or FIG. 5B.

FIG. 10A illustrates a schematic cross-sectional view of the display panel in the direction C-C according to the embodiment as shown in FIG. 5A or FIG. 5B, and FIG. 10B shows another schematic cross-sectional view of the display panel in the direction C-C according to the embodiment as shown in FIG. 5A or FIG. 5B.

According to some embodiments of the present disclosure, as shown in FIG. 10A or FIG. 10B, the non-display region circuit 104' may further comprise a peripheral wiring 1007, a first electrode pattern 1009 and a pixel definition pattern 1028 which are located at the interlayer insulating layer 605 or 1003.

According to some embodiments of the present disclosure, the peripheral wiring 1007 may comprise a VSS power supply line, but is not limited thereto. According to some embodiments of the present disclosure, the peripheral wiring 1007 may be provided at the same layer as the source 1010 and the drain 1011. According to some embodiments of the present disclosure, as shown in FIG. 10A or FIG. 10B, the peripheral wiring 1007 may be electrically connected to the first electrode pattern 1009. For example, as shown in FIG. 10A or FIG. 10B, the peripheral wiring 1007 may be in contact with the first electrode pattern 1009 under the pixel defining pattern 1028 to achieve electrical connection, but is not limited thereto.

According to some embodiments of the present disclosure, the first electrode pattern 1009 and the first electrode 112 may be located at the same layer and have the same material, and the pixel defining pattern 1028 and the pixel defining layer 1013 may be located at the same layer and have the same material. As shown in FIG. 10A or FIG. 10B, the first electrode pattern 1009 may also be electrically connected to the second electrode 115 located at the peripheral wiring region 10f.

Figure 10C:
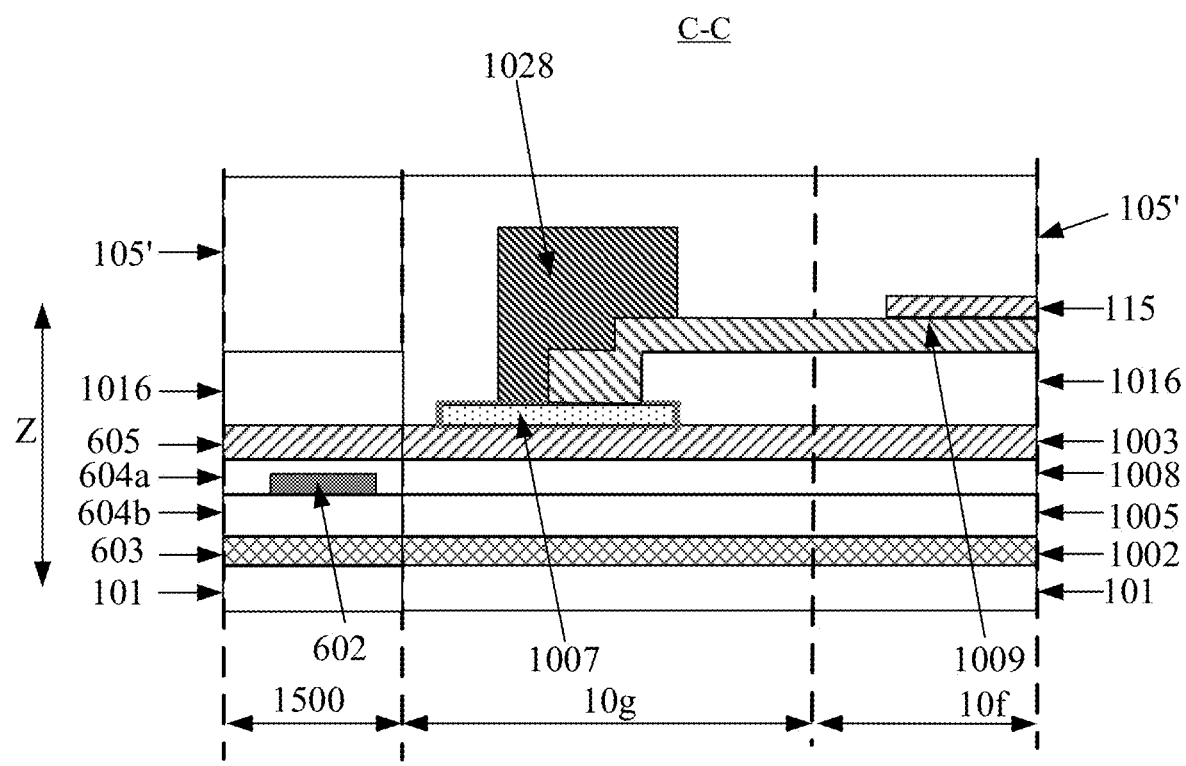
FIG. 10C illustrates another schematic cross-sectional view of the display panel in the direction C-C according to the embodiment as shown in FIG. 5A or FIG. 5B.
Figure 10D:
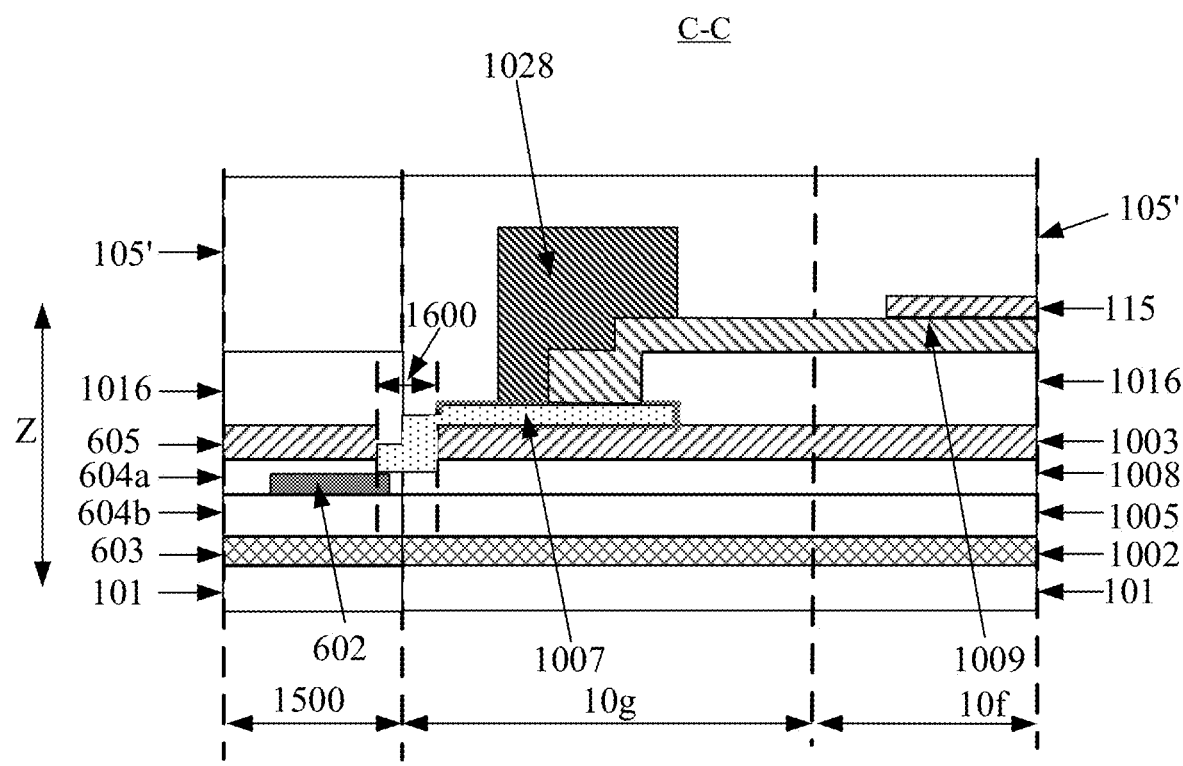
FIG. 10D illustrates another schematic cross-sectional view of the display panel in the direction C-C according to the embodiment as shown in FIG. 5A or FIG. 5B.

FIG. 10C illustrates another schematic cross-sectional view of the display panel in the direction C-C according to the embodiment as shown in FIG. 5A or FIG. 5B, and FIG. 10D illustrates another schematic cross-sectional view of the display panel in the direction C-C according to the embodiment as shown in FIG. 5A or FIG. 5B.

In some embodiments, the first conductive pattern 602 and the peripheral wiring 1007 are electrically connected with each other by a manner of edge overlap, which can be connected in parallel, thereby reducing IR Drop. For example, in some embodiments, as shown in FIG. 10D, the portion 1600 of the interlayer insulating layers 605 and 1003 between the first conductive pattern 602 and the peripheral wiring 1007 may be removed, so that a via-hole or a gap may be formed in the interlayer insulating layers 605 and 1003, and thus the first conductive pattern 602 and the peripheral wiring 1007 are in contact with each other to achieve electrical connection.

In some embodiments, as shown in FIG. 10C, the first conductive pattern 602 may not be electrically connected to the peripheral wiring 1007, that is, the first conductive pattern 602 is electrically insulated from the peripheral wiring 1007.

According to some embodiments of the present disclosure, as shown in FIG. 10A, the end E2 of the peripheral wiring 1007 close to the outer edge E1 of the display panel may be closer to the outer edge E1 of the display panel than the end E3 of the pixel defining pattern 1028 close to the outer edge E1 of the display panel. Furthermore, another end E5 of the peripheral wiring 1007 away from the outer edge E1 of the display panel may be substantially flush with another end E4 of the pixel defining pattern 1028 away from the outer edge E1 of the display panel.

According to some embodiments of the present disclosure, as shown in FIG. 10B, the end E2 of the peripheral wiring 1007 close to the outer edge E1 of the display panel may be closer to the outer edge E1 of the display panel than the end E3 of the pixel defining pattern 1028 close to the outer edge E1 of the display panel. Furthermore, another end E4 of the pixel defining pattern 1028 away from the outer edge E1 of the display panel may be farther away from the outer edge E1 of the display panel than another end E5' of the peripheral wiring 1007 away from the outer edge E1 of the display panel.

Figure 11A:
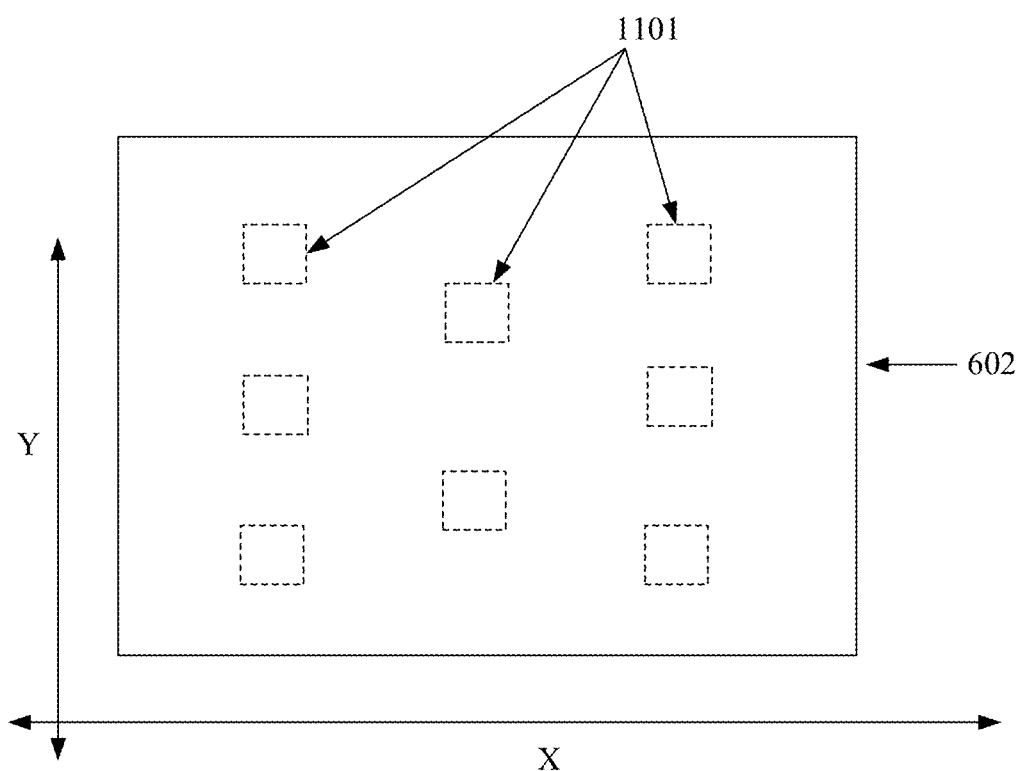
FIG. 11A illustrates a schematic plan view of a structure of a non-display region circuit according to some embodiments of the present disclosure.
Figure 11B:
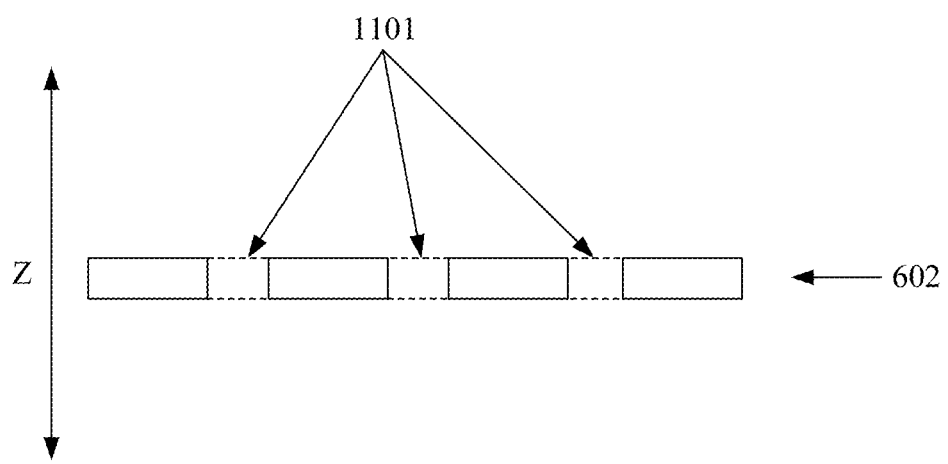
FIG. 11B illustrates a schematic cross-sectional view of the structure of the non-display region circuit as shown in FIG. 11A.

FIG. 11A illustrates a schematic plan view of a structure of a non-display region circuit according to some embodiments of the present disclosure. FIG. 11B illustrates a schematic cross-sectional view of the structure of the non-display region circuit as shown in FIG. 11A.

According to some embodiments of the present disclosure, as shown in FIG. 11A and FIG. 11B, the first conductive pattern 602 may comprise at least one second through-hole 1101. As shown in FIG. 11A, the shape of the second through-hole 1101 may be rectangular or square, but is not limited thereto. For example, the shape of the second through-hole 1101 may also be circular. Note that the number and the arrangement of the second through-hole 1101 are not limited. Since the second through-hole 1101 is provided in the first conductive pattern 602, at least a portion of the packaging layer 105' may be located within the second through-hole 1101. In some embodiments, portions of the film layers between the packaging layer 105' and the first conductive pattern 602 at the positions corresponding to the second through-hole 1101 is removed, so that at least a portion of the packaging layer 105' can be in contact with at least one of the at least one buffer layer 603 through the second through-hole 1101 of the first conductive pattern 602.

Figure 11C:
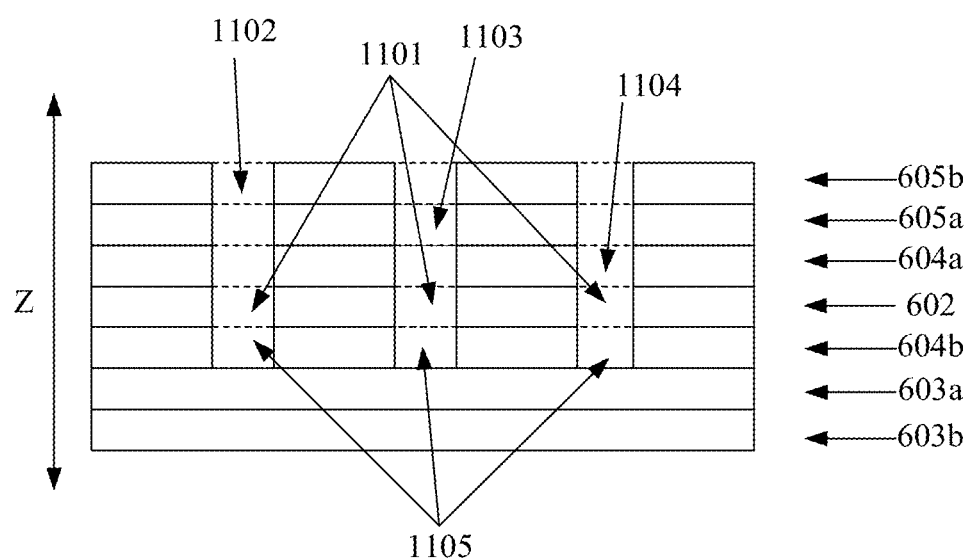
FIG. 11C illustrates another schematic cross-sectional view of the structure of the non-display region circuit as shown in FIG. 11A.

FIG. 11C illustrates another schematic cross-sectional view of the structure of the non-display region circuit as shown in FIG. 11A. According to some embodiments of the present disclosure, as shown in FIG. 11C, the at least one interlayer insulating layer 605 may comprise at least one first through-hole 1102 and 1103, and at least a portion of the packaging layer 105' may be located within the at least one first through-hole 1102 and 1103. In some embodiments, the shape, the number and the arrangement of the first through-holes 1102 and 1103 in the interlayer insulating layer 605 may be the same as those of the second through-hole 1101 in the first conductive pattern 602, respectively.

According to some embodiments of the present disclosure, as shown in FIG. 11C, the portions 1102, 1103 and 1104 of the at least one interlayer insulating layer 605 and the first gate insulating layer 604a at positions corresponding to the at least one second through-hole 1101 of the first conductive pattern 602 are removed, so that the packaging layer 105' can be in contact with at least one of the at least one buffer layer 603 through the at least one second through-hole 1101. That is, the first gate insulating layer 604a may comprise at least one first through-hole 1104, and at least a portion of the packaging layer 105' may be located within the at least one first through-hole 1104 of the first gate insulating layer 604a. In some embodiments, the shape, the number and the arrangement of the at least one first through-hole 1104 in the first gate insulating layer 604a may be the same as those of the second through-hole 1101 in the first conductive pattern 602, respectively.

In some embodiments, the planarization pattern is located between the packaging layer 105' and the interlayer insulating layer. The planarization pattern has a similar structure to that of the interlayer insulating layer and the gate insulating layer, and through-holes can also be formed in the planarization pattern so that the packaging layer 105' can be in contact with at least one of the at least one buffer layer 603 through the through-hole.

Since the first through-holes 1102 and 1103 are provided in the interlayer insulating layer 605, and the at least one first through-hole 1104 is provided in the first gate insulating layer 604a, at least a portion of the packaging layer 105' can be in contact with at least one of the at least one buffer layer 603 through the first through-holes 1102 and 1103 in the interlayer insulating layer 605a and 605b, the at least one first through-hole 1104 in the first gate insulating layer 604a, and the second through-hole 1101 in the first conductive pattern 602.

According to some embodiments of the present disclosure, as shown in FIG. 11C, a portion 1105 of the second gate insulating layer 604b at a position corresponding to the at least one second through-hole 1101 of the first conductive pattern 602 is removed, so that the packaging layer 105' can be in contact with at least one of the at least one buffer layer 603 through the at least one second through-hole 1101. That is, the second gate insulating layer 604b may comprise at least one first through-hole 1105, and at least a portion of the packaging layer 105' may be located within the at least one first through-hole 1105 of the second gate insulating layer 604b. In some embodiments, the shape, the number and the arrangement of the at least one first through-hole 1105 in the second gate insulating layer 604b may be the same as those of the second through-hole 1101 in the first conductive pattern 602, respectively.

Since the first through-holes 1102 and 1103 are provided in the interlayer insulating layer 605, the at least one first through-hole 1104 is provided in the first gate insulating layer 604*a*, and the at least one first through-hole 1105 is provided in the second gate insulating layer 604*b*, at least a portion of the packaging layer 105' can be in contact with at least one of the at least one buffer layer 603 through the first through-holes 1102 and 1103 in the interlayer insulating layer 605, the at least one first through-hole 1104 in the first gate insulating layer 604*a*, the second opening 1101 in the first conductive pattern 602, and the at least one first through-hole 1105 in the second gate insulating layer 604*b*.

Figure 12A:
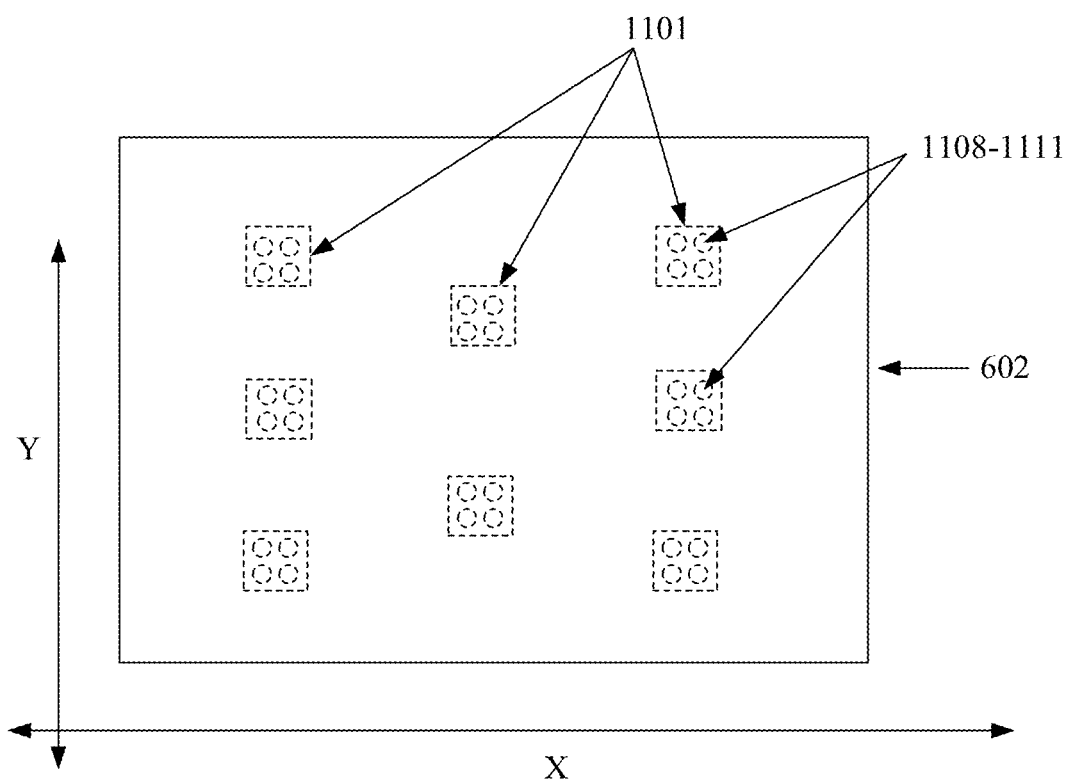
FIG. 12A illustrates a schematic plan view of another structure of the non-display region circuit according to some embodiments of the present disclosure.
Figure 12B:
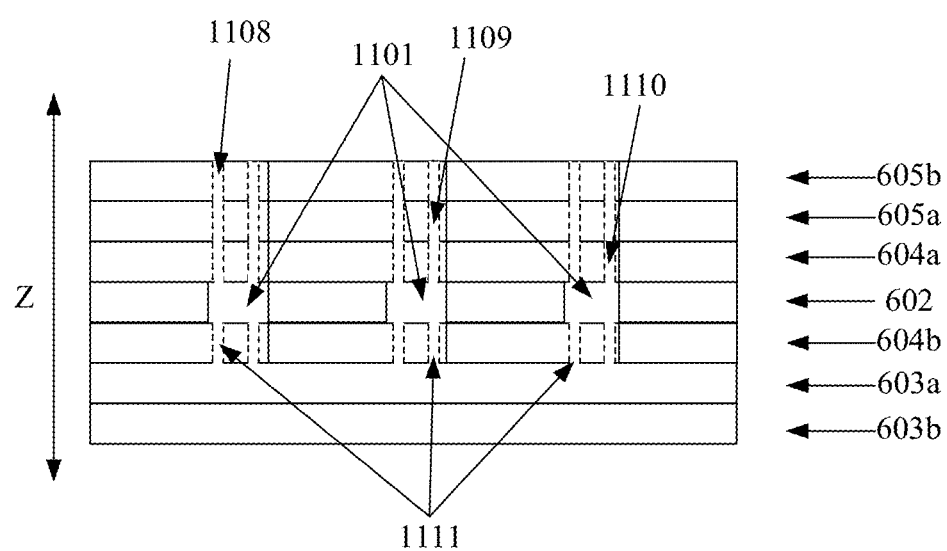
FIG. 12B illustrates a schematic cross-sectional view of another structure of the non-display region circuit as shown in FIG. 12A.
Figure 12C:
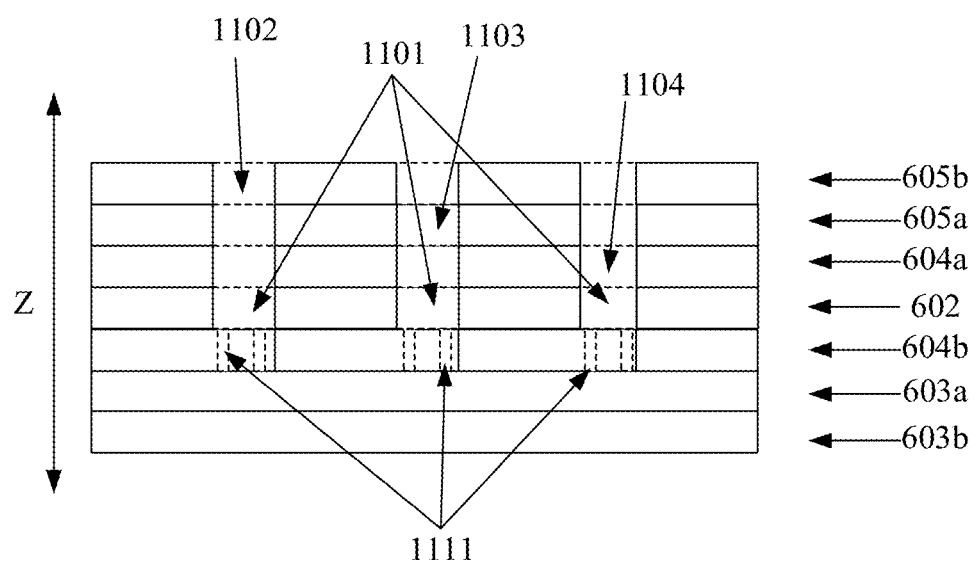
FIG. 12C illustrates another schematic cross-sectional view of another structure of the non-display region circuit as shown in FIG. 12A.
Figure 12D:
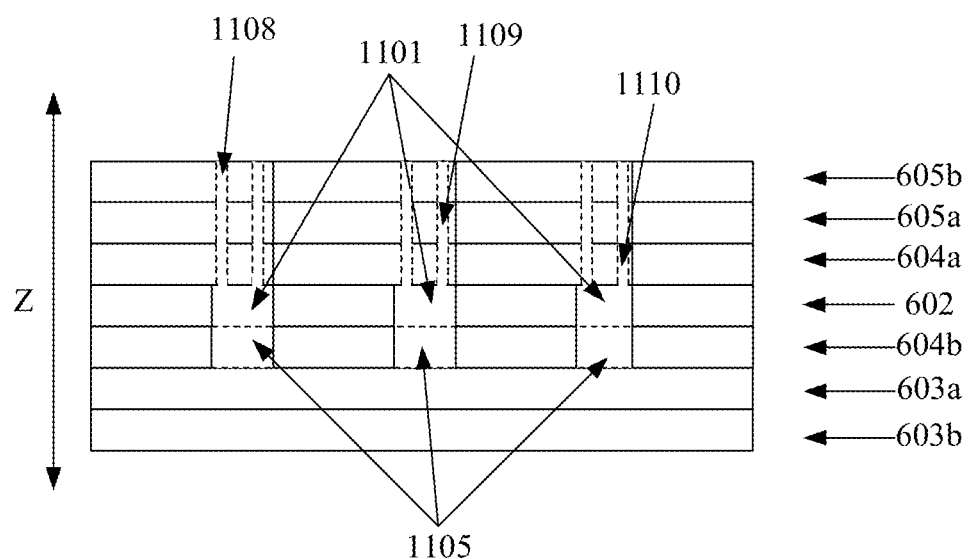
FIG. 12D illustrates another schematic cross-sectional view of another structure of the non-display region circuit as shown in FIG. 12A.

FIG. 12A illustrates a schematic plan view of another structure of the non-display region circuit according to some embodiments of the present disclosure; FIG. 12B illustrates a schematic cross-sectional view of another structure of the non-display region circuit as shown in FIG. 12A; FIG. 12C illustrates another schematic cross-sectional view of another structure of the non-display region circuit as shown in FIG. 12A; and FIG. 12D illustrates another schematic cross-sectional view of another structure of the non-display region circuit as shown in FIG. 12A.

According to some embodiments of the present disclosure, as shown in FIGS. 12A to 12D, a plurality of third through-holes 1108-1110 are provided in the at least one interlayer insulating layer 605 and the first gate insulating layer 604*a* at the positions corresponding to the at least one second through-hole 1101 of the first conductive pattern 602, so that the packaging layer 105' can be in contact with at least one of the at least one buffer layer 603 through the plurality of third through-holes 1108-1110 and the at least one second through-hole 1101. As shown in FIG. 12A, the shape of the third through-holes 1108-1110 may be circular, but is not limited thereto. For example, the shape of the third through-holes 1108-1110 may also be rectangular or square. Note that the number and the arrangement of the third through-holes 1108-1110 are not limited. Since the third through-holes 1108-1110 are provided in the at least one interlayer insulating layer 605 and the first gate insulating layer 604*a*, at least a portion of the packaging layer 105' may be located within the third through-holes 1108-1110. That is, at least a portion of the packaging layer 105' may be in contact with at least one of the at least one buffer layer 603 through the third through-holes 1108-1110 in the at least one interlayer insulating layer 605 and the first gate insulating layer 604*a*, and the second through-hole 1101 in the first conductive pattern 602.

According to some embodiments of the present disclosure, a plurality of third through-holes 1111 are provided in the second gate insulating layer 604*b* at a position corresponding to the at least one second through-hole 1101 of the first conductive pattern 602, so that the packaging layer 105' can be in contact with at least one of the at least one buffer layer 603 through the at least one second through-hole 1101 and the plurality of third through-holes 1111. Since the third through-holes 1111 are provided in the second gate insulating layer 604*b*, at least a portion of the packaging layer 105' may be located within the third through-hole 1111. That is, at least a portion of the packaging layer 105' may be in contact with at least one of the at least one buffer layer 603 through the second through-hole 1101 in the first conductive pattern 602 and the plurality of third through-holes 1111 in the second gate insulating layer 604*b*.

According to some embodiments of the present disclosure, the maximum aperture of the third through-holes 1108-1111 may be smaller than the maximum aperture of the second through-hole 1101. That is, as shown in FIGS. 12A and 12B, the orthographic projection of the third through-holes 1108-1111 on the substrate 101 may fall within the orthographic projection of the second through-hole 1101 on the substrate 101.

In some embodiments, the first through-holes 1102-1105 or the third through-holes 1108-1111 in the at least one interlayer insulating layer 605 and the at least one gate insulating layer 604 may be combined. For example, as shown in FIG. 12B, at least one interlayer insulating layer 605 and the at least one gate insulating layer 604 may each comprise the third through-holes 1108-1111. For another example, as shown in FIG. 12C, the at least one interlayer insulating layer 605 and the first gate insulating layer 604*a* may each comprise the first through-holes 1102-1104, and the second gate insulating layer 604*b* may comprise the third through-hole 1111. In some embodiments, as shown in FIG. 12D, the at least one interlayer insulating layer 605 and the first gate insulating layer 604*a* may each comprise the third through-holes 1108-1110, and the second gate insulating layer 604*b* may comprise the third through-hole 1105. Note that the first through-holes 1102-1105 or the third through-hole 1108-1111 in the at least one interlayer insulating layer 605 and the at least one gate insulating layer 604 can also be combined in other ways.

Since the first conductive pattern 602 comprises the first through-hole 1101, the at least one interlayer insulating layer 605 comprises the first through-holes 1102-1105 or the second through-holes 1108 to 1111, and the at least one gate insulating layer comprises the first through-holes 1102-1105 or the second through-holes 1108 to 1111, at least a portion of the packaging layer 105' can be in contact with at least one of the at least one buffer layer 603, which can improve the sealing degree of the packaging of the display panel, and thus can further improve the antistatic ability of the display panel.

The various embodiments in the present specification are described in a progressive manner, and each embodiment focuses on differences from other embodiments, and the same or similar parts between the various embodiments can be referred to each other.

Finally, it should also be noted that in this context, relational terms such as first and second are used merely to distinguish one entity or operation from another entity or operation, and do not necessarily require or imply there is any such actual relationship or order between these entities or operations. Furthermore, the terms "comprise", "include" or any other variant is intent to cover a non-exclusive meaning, such that a process, method, product, or equipment including a series of elements includes not only those elements but also other elements which are not clearly listed or elements which are inherent to such process, method, product, or equipment. Without a further limitation, an element that is defined by the phrase "comprising a . . . " does not exclude the presence of additional same elements in the process, method, product or equipment which includes the elements.

The display panel and the display apparatus provided by the present disclosure are described in detail. The principles and implementations of the present disclosure are described herein by using specific examples. The description of the above embodiments is only for helping to understand the method and core idea of the present disclosure. At the same time, for those skilled in the art, there will be changes in the specific embodiments and application scopes according to the concept of the present disclosure. To sum up, the contents of the present specification should not be construed as being a limit to the present disclosure.

What is claimed is:

1. A display panel, comprising:
a substrate which comprises a substrate display region corresponding to a display panel display region and a substrate non-display region corresponding to a display panel non-display region;
a non-display region circuit which is located at the substrate non-display region;
a packaging layer which is located on the non-display region circuit and has an area at least partially overlapping with the non-display region circuit; and
a display region circuit located at the substrate display region, wherein the display region circuit comprises a thin film transistor which comprises a gate, a source, a drain and an active layer,
wherein the non-display region circuit comprises:
   a first conductive pattern;
   at least one buffer layer which is located at a side of the first conductive pattern close to the substrate;
   at least one gate insulating layer which is configured to electrically insulate the first conductive pattern and other conductive patterns; and
   at least one interlayer insulating layer which is located at a side of the first conductive pattern away from the substrate,
the first conductive pattern and the gate are located at a same layer and have same material, and
the at least one interlayer insulating layer is located between the packaging layer and the first conductive pattern, and the at least one interlayer insulating layer comprises at least one first through-hole, and at least a part of the packaging layer is located in the at least one first through-hole.

2. The display panel of claim 1, wherein the packaging layer comprises a frit.

3. The display panel of claim 1, further comprising:
a display device which is located at the substrate display region, wherein the display device comprises a plurality of pixel units and a pixel defining layer, each of the plurality of pixel units comprises a first electrode electrically connected to the thin film transistor, and the pixel defining layer is configured to define the plurality of pixel units, wherein
the non-display region circuit further comprises a peripheral wiring, a first electrode pattern and a pixel defining pattern which are located on the interlayer insulating layer, wherein the peripheral wiring comprises a VSS power line, the first electrode pattern and the first electrode are located at a same layer and have same material, and the pixel defining pattern and the pixel defining layer are located at a same layer and have same material.

4. The display panel of claim 1, wherein
the at least one buffer layer comprises at least a first buffer layer and a second buffer layer, wherein the first buffer layer is closer to the first conductive pattern than the second buffer layer, and a thickness of the first buffer layer is greater than that of the second buffer layer.

5. The display panel of claim 1, wherein
the at least one interlayer insulating layer comprises at least a first interlayer insulating layer and a second interlayer insulating layer, wherein the first interlayer insulating layer is closer to the first conductive pattern than the second interlayer insulating layer, and a thickness of the first interlayer insulating layer is greater than that of the second interlayer insulating layer.

6. The display panel of claim 1, wherein
the packaging layer is provided symmetrically on a left side and a right side of the display panel, and is provided asymmetrically on an upper side and a lower side of the display panel.

7. The display panel of claim 1, further comprising:
a crack detection line which is located between the non-display region circuit and an outer edge of the display panel.

8. The display panel of claim 1, further comprising:
a protective layer which is located at package sides, and a gap is present between the protective layer and the packaging layer.

9. A display apparatus comprising the display panel according to claim 1.

10. A display panel, comprising:
a substrate which comprises a substrate display region corresponding to a display panel display region and a substrate non-display region corresponding to a display panel non-display region;
a non-display region circuit which is located at the substrate non-display region;
a packaging layer which is located on the non-display region circuit and has an area at least partially overlapping with the non-display region circuit;
wherein the non-display region circuit comprises:
   a first conductive pattern which comprises at least one second through-hole;
   at least one buffer layer which is located at a side of the first conductive pattern close to the substrate;
   at least one gate insulating layer which is configured to electrically insulate the first conductive pattern and other conductive patterns; and
   at least one interlayer insulating layer which is located at a side of the first conductive pattern away from the substrate,
the at least one gate insulating layer comprises a first gate insulating layer which is located at a side of the first conductive pattern away from the substrate; and
portions of the at least one interlayer insulating layer and the first gate insulating layer at a position corresponding to the at least one second through-hole of the first conductive pattern are removed, so that the packaging layer is able to be in contact with at least one of the at least one buffer layer through the at least one second through-hole.

11. The display panel of claim 10, wherein
a plurality of third through-holes are provided in the at least one interlayer insulating layer and the first gate insulating layer at the position corresponding to the at least one second through-hole of the first conductive pattern, so that the packaging layer is able to be in contact with at least one of the at least one buffer layer through the plurality of third through-holes and the at least one second through-hole, wherein a maximum aperture of the third through-holes is smaller than that of the second through-hole.

12. The display panel of claim 11, wherein
the at least one gate insulating layer further comprises a second gate insulating layer which is located between the first conductive pattern and the at least one buffer layer.

13. The display panel of claim 12, wherein
a portion of the second gate insulating layer at the position corresponding to the at least one second through-hole of the first conductive pattern is removed, so that the packaging layer is able to be in contact with at least one of the at least one buffer layer through the at least one second through-hole.

14. The display panel of claim 13, wherein a plurality of third through-holes are provided in the second gate insulating layer at the position corresponding to the at least one second through-hole of the first conductive pattern, so that the packaging layer is able to be in contact with at least one of the at least one buffer layer through the at least one second through-hole and the plurality of third through-holes.

15. A display panel comprising:
a substrate which comprises a substrate display region corresponding to a display panel display region and a substrate non-display region corresponding to a display panel non-display region;
a non-display region circuit which is located at the substrate non-display region;
a packaging layer which is located on the non-display region circuit and has an area at least partially overlapping with the non-display region circuit;
a display region circuit located at the substrate display region, wherein the display region circuit comprises a thin film transistor which comprises a gate, a source, a drain and an active layer, and
a display device which is located at the substrate display region, wherein the display device comprises a plurality of pixel units and a pixel defining layer, each of the plurality of pixel units comprises a first electrode electrically connected to the thin film transistor, and the pixel defining layer is configured to define the plurality of pixel units,
wherein the non-display region circuit comprises:
a first conductive pattern;
at least one buffer layer which is located at a side of the first conductive pattern close to the substrate;
at least one gate insulating layer which is configured to electrically insulate the first conductive pattern and other conductive patterns; and
at least one interlayer insulating layer which is located at a side of the first conductive pattern away from the substrate,
the first conductive pattern and the gate are located at a same layer and have same material, and
the non-display region circuit further comprises a peripheral wiring, a first electrode pattern and a pixel defining pattern which are located on the interlayer insulating layer, wherein the peripheral wiring comprises a VSS power line, the first electrode pattern and the first electrode are located at a same layer and have same material, and the pixel defining pattern and the pixel defining layer are located at a same layer and have same material,
an end of the peripheral wiring close to an outer edge of the display panel is closer to the outer edge of the display panel than an end of the pixel defining pattern close to the outer edge of the display panel;
another end of the peripheral wiring away from the outer edge of the display panel is substantially flush with another end of the pixel defining pattern away from the outer edge of the display panel; and
the first electrode pattern is electrically connected to the peripheral wiring.

16. A display panel comprising:
a substrate which comprises a substrate display region corresponding to a display panel display region and a substrate non-display region corresponding to a display panel non-display region;
a non-display region circuit which is located at the substrate non-display region;
a packaging layer which is located on the non-display region circuit and has an area at least partially overlapping with the non-display region circuit;
a display region circuit located at the substrate display region, wherein the display region circuit comprises a thin film transistor which comprises a gate, a source, a drain and an active layer, and
a display device which is located at the substrate display region, wherein the display device comprises a plurality of pixel units and a pixel defining layer, each of the plurality of pixel units comprises a first electrode electrically connected to the thin film transistor, and the pixel defining layer is configured to define the plurality of pixel units,
wherein the non-display region circuit comprises:
a first conductive pattern;
at least one buffer layer which is located at a side of the first conductive pattern close to the substrate;
at least one gate insulating layer which is configured to electrically insulate the first conductive pattern and other conductive patterns; and
at least one interlayer insulating layer which is located at a side of the first conductive pattern away from the substrate,
the first conductive pattern and the gate are located at a same layer and have same material, and
the non-display region circuit further comprises a peripheral wiring, a first electrode pattern and a pixel defining pattern which are located on the interlayer insulating layer, wherein the peripheral wiring comprises a VSS power line, the first electrode pattern and the first electrode are located at a same layer and have same material, and the pixel defining pattern and the pixel defining layer are located at a same layer and have same material,
an end of the peripheral wiring close to an outer edge of the display panel is closer to the outer edge of the display panel than an end of the pixel defining pattern close to the outer edge of the display panel;
another end of the pixel defining pattern away from the outer edge of the display panel is farther away from the outer edge of the display panel than another end of the peripheral wiring away from the outer edge of the display panel; and
the first electrode pattern is electrically connected to the peripheral wiring.

* * * * *